(12) United States Patent
Kaneko et al.

(10) Patent No.: US 6,329,642 B1
(45) Date of Patent: Dec. 11, 2001

(54) SEMICONDUCTOR DEVICE AND SEMICONDUCTOR CHIP

(75) Inventors: Yoshio Kaneko, Kashiwa; Satoru Suto, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/526,469

(22) Filed: Mar. 15, 2000

(30) Foreign Application Priority Data

Mar. 16, 1999 (JP) .................................................. 11-070499

(51) Int. Cl.[7] ...................................................... H05B 1/02
(52) U.S. Cl. .......................... 219/497; 219/492; 219/501; 324/755; 324/760
(58) Field of Search ..................................... 219/494, 497, 219/499, 501, 505, 508, 492; 307/117; 392/416; 324/760, 755; 118/724, 725; 257/467, 468, 469, 604

(56) References Cited

U.S. PATENT DOCUMENTS

| 4,015,218 | * | 3/1977 | Sanderson | ............................ 331/111 |
| 5,517,053 | | 5/1996 | Dietz et al. . | |
| 5,723,998 | | 3/1998 | Saito et al. . | |
| 5,745,130 | * | 4/1998 | Becerra et al. | ......................... 347/14 |
| 5,892,408 | * | 4/1999 | Binder | ................................... 331/44 |

FOREIGN PATENT DOCUMENTS 8-055963   2/1996   (JP) .

* cited by examiner

Primary Examiner—M H Paschall
(74) Attorney, Agent, or Firm—Oblon, Spivak, McClelland, Maier & Neustadt, P.C.

(57) ABSTRACT

A semiconductor device has an oscillator for generating an oscillating signal whose frequency is dependent on temperature, a frequency tester for determining whether or not the frequency of the oscillating signal is normal, a heater for generating heat if the frequency tester determines that the frequency is abnormal, and a first hard macro core that is shifted to a normal operation mode if the frequency tester determines that the frequency is normal. The oscillator, heater, and first hard macro core are put under the same temperature condition. The frequency tester employs a lower limit of an operating temperature range of the first hard macro core as a reference to determine whether or not the frequency of the oscillating signal is normal.

20 Claims, 16 Drawing Sheets

SEMICONDUCTOR DEVICE AND SEMICONDUCTOR CHIP

BACKGROUND OF THE INVENTION

1. Field of the Invention

The present invention relates to semiconductor devices and semiconductor chips, and particularly, to a semiconductor device or a semiconductor chip having an operation securing circuit for controlling the temperature of hard macro cores contained in the semiconductor device or chip and securing a wide operating temperature range for the semiconductor device or chip.

2. Description of the Related Art

Digital consumer products such as digital cameras have a variety of functions such as image and voice processing functions, and therefore, they must have processing capacity comparable to personal computers. In addition, the digital consumer products are required to be compact, portable, low power consumption, and manufacturable at low cost. To meet these requirements, there are techniques to arrange integrated circuits having different functions on a single semiconductor chip to provide a one-chip system LSI. Such an LSI satisfies a variety of requirements and provides improved processing capacity.

The one-chip system LSI consists of different hard macro cores or functional blocks including microprocessors, digital signal processors, flash memories, static RAMS, and dynamic RAMS. To make the designing of system LSIs easier, a library is prepared to store data such as delay times and operating temperature ranges related to hard macro cores. Data about necessary hard macro cores is picked up from the library when designing a required system LSI.

The hard macro cores consist each of cells and have different operating temperature ranges. Accordingly, a system LSI consisting of different hard macro cores is designed to have an operating temperature range that is of a hard macro core having a narrowest operating temperature range. Namely, the lowest operating temperature of a system LSI is equal to a highest lower limit among the operating temperature ranges of hard macro cores contained in the system LSI. Similarly, the highest operating temperature of the system LSI is determined by a lowest higher limit among the operating temperature ranges of the hard macro cores. For example, a system LSI consisting of a hard macro core A having an operating temperature range of –10° C. to 80° C. and a hard macro core B having an operating temperature range of –40° C. to 60° C. assures an operating temperature range of –10° C. to 60° C. It is difficult for this system LSI to expand the operating temperature range while maintaining the operating temperature range of each hard macro core contained in the system LSI.

The operating temperature ranges of hard macro cores are usually dependent on periods they were developed, or on customers' requests. If a system LSI is made of a mixture of hard macro cores having different operating temperature ranges, the operating temperature range of the system LSI is restricted by the hard macro core that has the narrowest operating temperature range. To expand the operating temperature range of such a system LSI, the operating speed thereof must be sacrificed.

SUMMARY OF THE INVENTION

An object of the present invention is to provide a semiconductor device or chip capable of securing an operating temperature range that is wider than the operating temperature ranges of individual hard macro cores contained in the semiconductor device or chip.

Another object of the present invention is to provide a semiconductor device or chip incorporating hard macro cores having different cell arrangements, capable of securing a wide operating temperature range and specified operating speed.

Still another object of the present invention is to provide a semiconductor device capable of correctly grasping a temperature by arranging an oscillator close to a hard macro core that is susceptible to temperature.

Still another object of the present invention is to provide a semiconductor device or chip having a frequency tester that is designed to a customer's operating temperature range.

Still another object of the present invention is to provide a semiconductor device having a heater capable of properly heating a hard macro core.

Still another object of the present invention is to provide a semiconductor device capable of automatically starting o n at a specified operating speed even at a temperature that is below the operating temperature range of a hard macro core contained in the semiconductor device.

In order to accomplish the objects, a first aspect of the present invention provides a semiconductor device having an operation securing circuit. The operation securing circuit has an oscillator for generating an oscillating signal whose frequency is dependent on temperature, a frequency tester for determining whether or not the frequency of the oscillating signal is normal, a heater for generating heat if the frequency tester determines that the frequency is abnormal, and a first hard macro core that is shifted to a normal operation mode if the frequency tester determines that the frequency is normal. The oscillator, heater, and first hard macro core are put under the same temperature condition. The frequency tester employs a lower limit of an operating temperature range of the first hard macro core as a reference to determine whether or not the frequency of the oscillating signal is normal. Frequencies determined to be normal by the frequency tester correspond to temperatures under which the first hard macro core normally operates, and frequencies determined to be abnormal by the frequency tester correspond to temperatures under which the first hard macro core malfunctions. The operating temperature range of a hard macro core is dependent on an arrangement of cells in the hard macro core. Namely, hard macro cores having different cell arrangements have different operating temperature ranges.

If temperature decreases below the lower limit of the operating temperature range of the first hard macro core, the frequency tester determines that the frequency of the oscillating signal generated by the oscillator that is under the same temperature condition as the first hard macro core is abnormal, to start the heater that is also under the same temperature condition as the first hard macro core. This increases the temperature of the first hard macro core and oscillator to a temperature in the operating temperature range of the first hard macro core. Then, the frequency tester detects a normal frequency, to shift the first hard macro core to a normal operation mode. In this way, the first aspect of the present invention heats the first hard macro core above the lower limit of the operating temperature range thereof, so that the hard macro core may normally operate even in an ambient temperature that is below the operating temperature range thereof.

Consequently, the semiconductor device of the first aspect is capable of securing a wide operating temperature range, automatically starting operation at a specified operating speed even in a low ambient temperature, and expanding the degree of freedom in designing due to the wide operating temperature range that is secured without extending delay time.

The frequency tester of the operation securing circuit has a counter for measuring the frequency of the oscillating signal generated by the oscillator, a testing unit for determining whether or not the measured frequency is normal and providing a test result signal, and a heater controller for turning on the heater if the test result signal indicates that the measured frequency is abnormal and turning off the heater if it indicates that the measured frequency is normal. The oscillator, heater, and first hard macro core may be arranged on a fist semiconductor chip, so that they are put under the same temperature condition. This arrangement makes the semiconductor device compact The frequency tester may be arranged on a second semiconductor chip that is different from the first semiconductor chip. The semiconductor device may have a second hard macro core. The second hard macro core is arranged on the fist semiconductor chip, has a different cell arrangement from the first hard macro core, is started under a stop mode, and is shifted to a normal operation mode after the frequency tester detects a normal frequency. Even if the first semiconductor chip includes hard macro cores having different cell arrangements, the semiconductor device of the first aspect secures a wide operating temperature range without deteriorating a required operating speed.

It is preferable that the first hard macro core is arranged around the oscillator and the heater is arranged around the first hard macro core. This arrangement correctly grasps a temperature because the oscillator is close to the first hard macro core that is susceptible to temperature, evenly heats the first hard macro core because the heater is around the first hard macro core, and monitors the temperature of the first hard macro core at a location distant from the heater. The heater heats the first hard macro core, and when the oscillator that is distant from the heater reaches a specified temperature, the first hard macro core that is closer to the heater must be above the specified temperature. When the heater is turned off, the heater is the quickest to cool, and therefore, the oscillator, which is distant from the heater, becomes hotter than the first hard macro core. This produces a temperature gradient to extend the ON-state intervals of the heater.

The oscillator may be a ring oscillator consisting of an odd number of inverters connected in series with the last one being connected to the first one. The heater may consist of a pre-buffer and a main buffer. The pre-buffer consists of a PMOS and an NMOS connected in parallel and having small driving capacity. The main buffer consists of a PMOS and an NMOS that are connected in parallel with each other and are connected to the pre-buffer in series. The main buffer has large driving capacity. The main buffer passes a through current to generate heat without overshooting. The PMOS of the main buffer may have a capacitor of large capacitance between the gate and source electrodes thereof. Alternatively, the NMOS of the main buffer may have a capacitor of large capacitance between the gate and source electrodes thereof. The capacitor increases the driving capacity of the main buffer as well as the capacitance of the PMOS or NMOS. Instead of the buffers, the heater may be made of a resistor.

The heater controller may have an AND circuit for receiving a test result signal from the frequency tester and an oscillating signal from the oscillator and providing an output signal to the heater. This arrangement simplifies the semiconductor device, reduces the size thereof, standardizes the designing of the frequency tester, and enables the semiconductor device to be automatically designed according to id operating temperatures.

The frequency tester may be arranged on the first semiconductor chip. A plurality of operation securing circuits may be formed on the first semiconductor chip. All hard macro cores in the operation securing circuits are started under a stop mode and are shifted to a normal operation mode when all frequency testers of the operation securing circuits detect normal frequencies.

The semiconductor device may have a third hard macro core arranged on a third semiconductor chip. The third hard macro core is started under a stop mode and is shifted to a normal operation mode if the frequency tester detects a normal frequency.

A second aspect of the present invention provides a semiconductor chip having an operation securing circuit The operation securing circuit consists of an oscillator for generating an oscillating signal whose frequency is dependent on temperature, a frequency tester for determining whether or not the frequency of the oscillating signal is normal, a heater for generating heat if the frequency tester determines that the frequency is abnormal, and a first functional block that is shifted to a normal operation mode if the frequency tester determines that the frequency is normal. The frequency tester employs a lower limit of an operating temperature range of the first functional block as a reference to determine whether or not the frequency of the oscillating signal is normal.

If temperature decreases below the lower limit of the operating temperature range of the first functional block, the frequency tester determines that the frequency of the oscillating signal generated by the oscillator that is under the same temperature condition as the first functional block is abnormal, to start the heater that is also under the same temperature condition as the first functional block. This increases the temperature of the first functional block and oscillator to a temperature in the operating temperature range of the first functional block. Then, the frequency tester detects a normal frequency, to shift the first functional block to a normal operation mode. In this way, the second aspect heats the first functional block above the lower limit of the operating temperature range thereof, so that the first functional block may normally operate even in an ambient temperature that is below the operating temperature range.

The semiconductor chip of the second aspect is capable of securing a wide operating temperature range, automatically starting operation at a specified operating speed even in a low ambient temperature, and expanding the degree of freedom in designing due to the wide operating temperature range that is secured without extending delay time.

The frequency tester of the operation securing circuit of the second aspect has a counter for measuring the frequency of the oscillating signal generated by the oscillator, a testing unit for determining whether or not the measured frequency is normal and providing a test result signal, and a heater controller for turning on the heater if the test result signal indicates that the measured frequency is abnormal and turning off the heater if it indicates that the measured frequency is normal. The semiconductor chip of the second aspect may have a second functional block The second functional block has a different cell arrangement from the first functional block, is started under a stop mode, and is shifted to a normal operation mode after the frequency tester detects a normal frequency. It is preferable that the first functional block is arranged around the oscillator and the heater is arranged around the first functional block. The semiconductor chip may have a plurality of operation securing circuits. All functional blocks in the operation securing circuits are started under a stop mode and are shifted to a normal operation mode when all frequency testers of the operation securing circuits detect normal frequencies.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

First Embodiment

Figure 1:
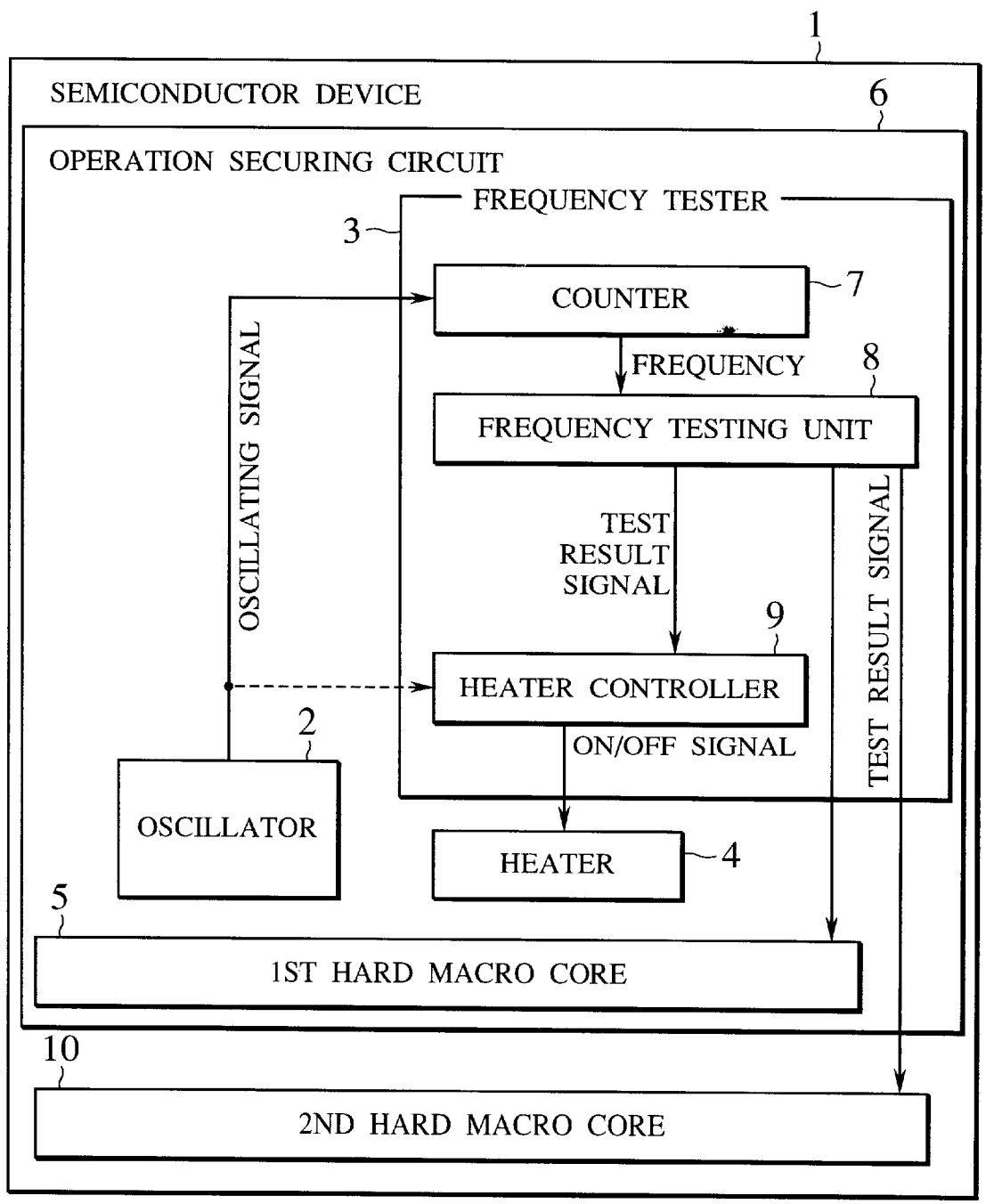
FIG. 1 is a block diagram showing a semiconductor device according to a first embodiment of the present invention.

FIG. 1 is a block diagram showing a semiconductor device according to the first embodiment of the present invention. The semiconductor device 1 has an operation securing circuit 6. The operation securing circuit 6 has an oscillator 2 for generating an oscillating signal whose frequency has temperature dependency, a frequency tester 3 for determining whether or not the frequency of the oscillating signal is normal, a heater 4 that is turned on if the frequency tester 3 determines that the frequency of the oscillating signal is abnormal, and a first hard macro core 5 that is shifted to a normal operation mode if the frequency tester 3 determines that the frequency of the oscillating signal is normal. The oscillator 2, heater 4, and first hard macro core 5 are arranged under the same temperature condition. The frequency tester 3 uses a lower limit of an operating temperature range of the first hard macro core 5 as a reference to determine whether or not the frequency of the oscillating signal is normal. Hard macro cores described in this specification are functional macro blocks such as microprocessors, digital signal processors, flash memories, static RAMs, and dynamic RAMs having specified shapes on semiconductor chips.

The frequency tester 3 has a counter 7 for measuring the frequency of an oscillating signal provided by the oscillator 2, a frequency testing unit 8 for determining whether or not the measured frequency is normal and providing a test result signal, and a heater controller 9 for tuning on the heater 4 if the test result signal indicates that the measured frequency is abnormal and turning off the heater 4 if it indicates that the measured frequency is normal.

A frequency testing unit 8 may have two decision levels. One is set for determining whether frequency is normal or abnormal. The other is set for deciding whether heater 4 should be ON or OFF. The later decision level is set just lower frequency than the other. The two decision levels will bring the device better temperature control, decreasing abnormal period of the first hard macro core 5 while heater 4 is in the ON/OFF sequence.

The semiconductor device 1 further has a second hard macro core 10 that is started under a stop mode and is shifted to a normal operation mode after the frequency tester 3 detects a normal frequency. The first and second hard macro cores 5 and 10 have different cell arrangements. The second hard macro core 10 may be replaced with a combination of general cell circuits.

Figure 2:
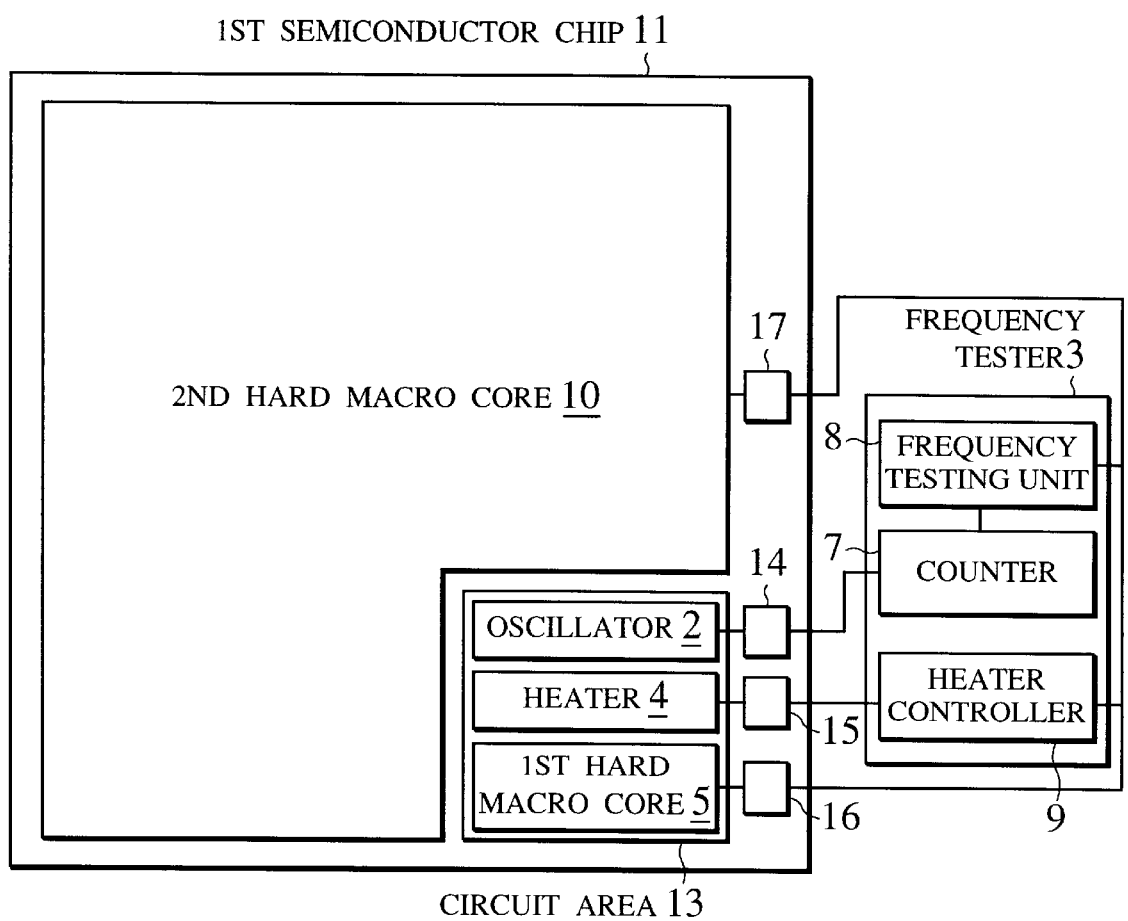
FIG. 2 is a plan view showing the semiconductor device of the first embodiment.

FIG. 2 is a plan view showing the semiconductor device 1 of the first embodiment. The semiconductor device 1 includes a first semiconductor chip 11, which contains a circuit area 13 and the second hard macro core 10. The circuit area 13 includes the oscillator 2, heater 4, and first hard macro core 5. The frequency tester 3 is arranged on a second semiconductor chip that is different from the first semiconductor chip 11. The first semiconductor chip 11 has, at the periphery thereof, an output terminal 14 for providing an oscillating signal generated by the oscillator 2 to the outside, an input terminal 15 for receiving an ON/OFF signal for the heater 4, and input terminals 16 and 17 for receiving a test result signal for the first and second hard macro cores 5 and 10 from the testing unit 8. The output terminal 14 is connected to the counter 7. The input terminal 15 is connected to the heater controller 9. The input terminals 16 and 17 are connected to the testing unit 8.

Figure 3:
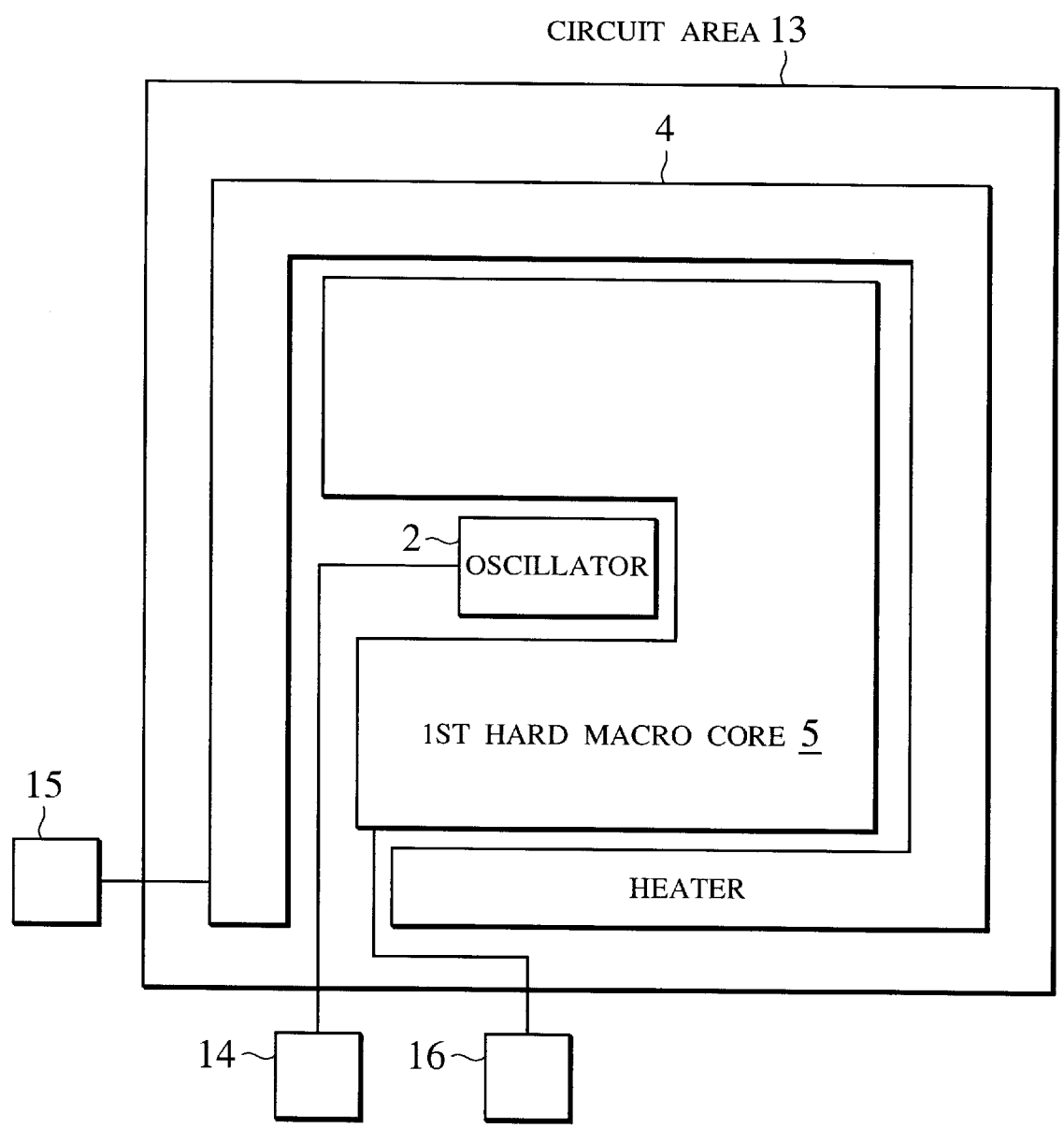
FIG. 3 is a plan view showing the details of a circuit area 13 of FIG. 2.

FIG. 3 is a plan view showing the circuit area 13. The first hard macro core 5 is arranged around the oscillator 2, and the heater 4 is arranged around the first hard macro core 5. One or more oscillators 2 may be arranged at the periphery of the circuit area 13, to improve heating efficiency and reducing the power consumption of the heater 4. The first hard macro core 5 may consist of a plurality of hard macro cores. In this case, each of the hard macro cores is connected to the input terminal 16 to receive a test result signal.

Figure 4A:
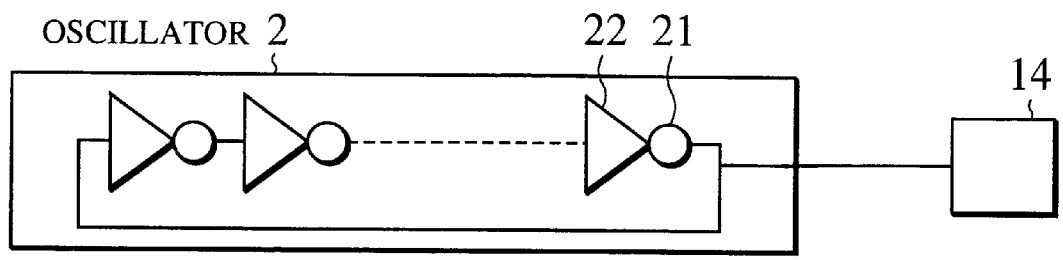
FIG. 4A is a circuit diagram showing an oscillator 2 of FIG. 2.

FIG. 4A is a circuit diagram showing the details of the oscillator 2. In this example, the oscillator 2 is a ring oscillator consisting of an odd number of inverters 22 connected in series with the last inverter being connected to the fit inverter. An output terminal 21 of one of the inverters 22 is connected to the output terminal 14.

Figure 4B:
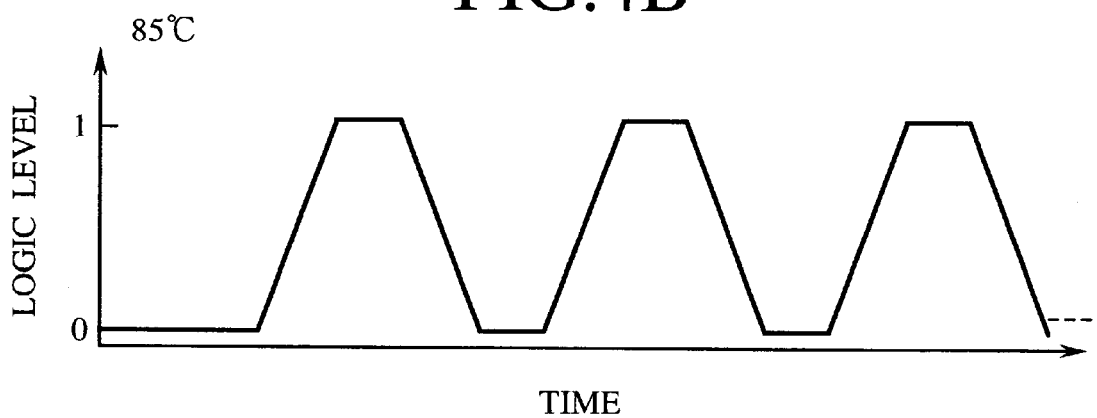
FIGS. 4B and 4C are waveforms showing the temperature dependency of an oscillating signal generated by the oscillator 2.
Figure 4C:
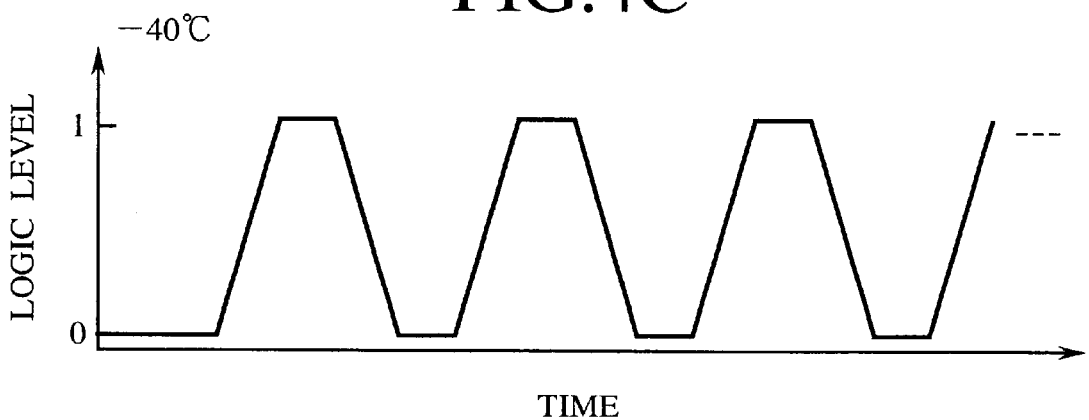

FIGS. 4B and 4C are graphs showing the temperature dependency of the frequency of an oscillating signal generated by the oscillator 2, in which FIG. 4B shows the waveform of an oscillating signal generated by the oscillator 2 at 85° C. and FIG. 4C the waveform of an oscillating signal generated by the same at 40° C. The signals alternate between logic levels of 1 and 0. The frequency of each signal is in inverse proportion to the temperature of the inverters 22. When the temperature drops to −40° C. as shown in FIG. 4C, the delay time of each inverter 22 becomes shorter to increase the frequency of the signal. When the temperature of the oscillator 2 increases to 85° C. as shown in FIG. 4B, the delay time of each inverter 22 becomes longer to decrease the frequency of the signal. The temperature dependency of the frequency of an oscillating signal generated by the oscillator 2 is measured in advance so that a temperature becomes measurable from the frequency of an oscillating signal generated by the oscillator 2.

Figure 5A:
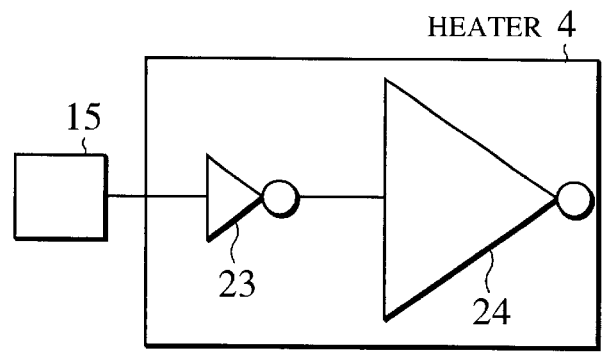
FIG. 5A is a block diagram showing a heater 4 of FIG. 2.

FIG. 5A is a circuit diagram showing the heater 4. The heater 4 has a pre-buffer 23 having small driving capacity and a main buffer 24 having large driving capacity. An output terminal of the pre-buffer 23 is connected to an input terminal of the main buffer 24. An input terminal of the pre-buffer 23 is connected to the input terminal 15 for receiving an ON/OFF signal from the heater controller 9.

Figure 5B:
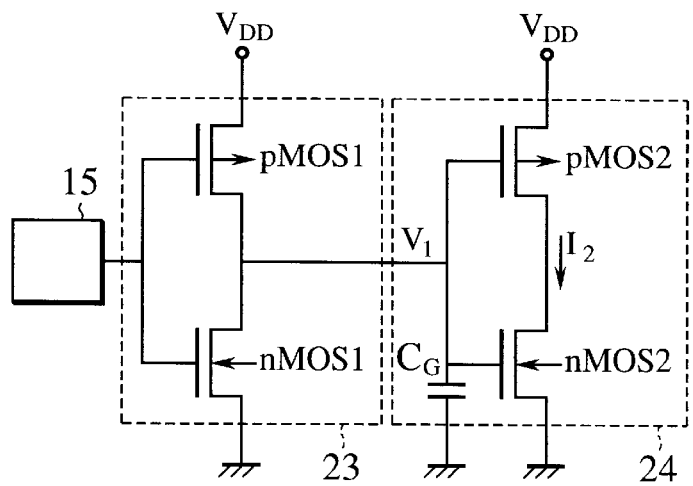
FIG. 5B is a circuit diagram showing the heater 4.

FIG. 5B is a circuit diagram showing the details of the heater 4. The pre-buffer 23 consists of a PMOS 1 and an NMOS 1 connected in parallel. The main buffer 24 consists of a PMOS 2 and an NMOS 2 connected in parallel. The gate width of the NMOS 2 is widened to form a large capacitance load $C_G$ between the gate and source electrodes of the NMOS 2, to increase the driving capacity of the main buffer 24. Alternatively, the large capacitance load $C_G$ may be formed between the gate and source electrodes of the PMOS 2 It is possible to widen the gate width of a single NMOS, or the whole gate width of a plurality of NMOSs connected in parallel.

Figure 5C:
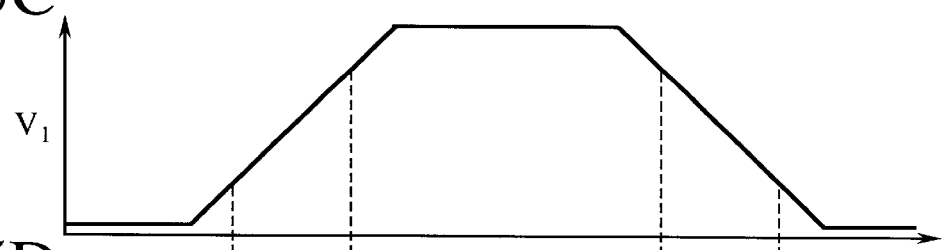
FIG. 5C is the waveform of a voltage supplied to a main buffer 24 of the heater 4.
Figure 5D:
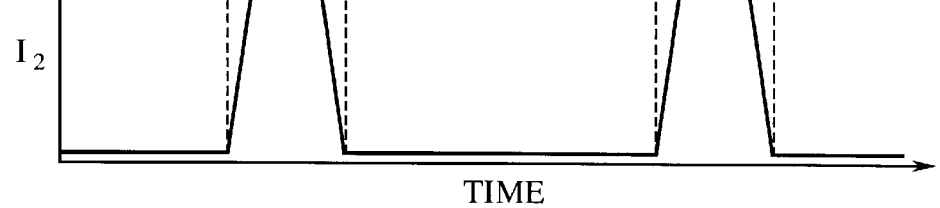
FIG. 5D is the waveform of a through current flowing between the source voltage (Vdd) and ground potential of the main buffer 24.

FIG. 5C shows the waveform of an input voltage V1 to the main buffer 24, and FIG. 5D shows the waveform of a through current 12 passing through the main buffer 24. Due to the large capacitance load $C_G$, the rise and fall of the input voltage V1 show each a gentle slope. Since the main buffer 24 involves the CMOS structure, the PMOS 2 and NMOS 2 are ON when the input voltage V1 is in the middle of a rise or fall. As a result, the source and drain electrodes of the PMOS 2 and NMOS 2 become conductive to pass a large through current between a source voltage VDD and a ground potential as shown in FIG. 5D. Due to this large through current, the PMOS 2 and NMOS 2 generate heat, which the heat source of the heater 4.

Figure 6:
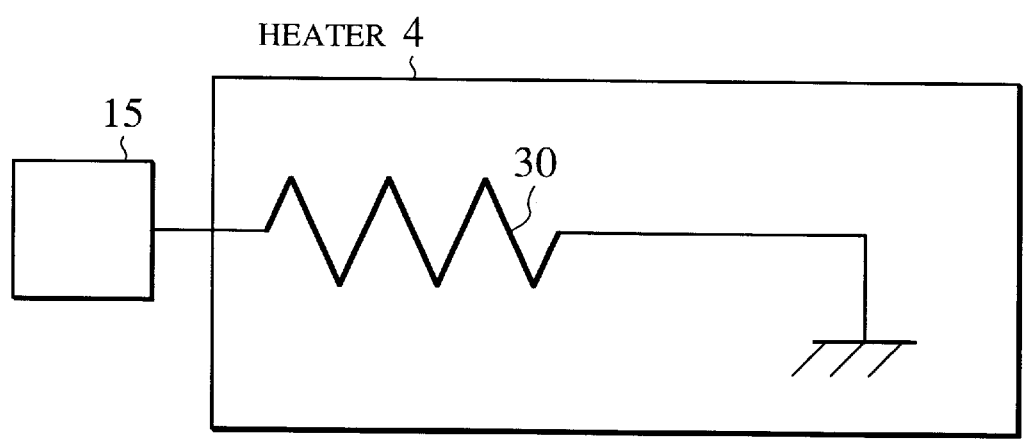
FIG. 6 is a circuit diagram showing a heater 4 made of a resistor 30.

FIG. 6 is a circuit diagram showing another example of the heater 4. This heater is made of a resistor 30. The resistor 30 may be a polysilicon resistor formed on a semiconductor substrate, or a diffusion layer resistor formed by injecting impurity ions into a semiconductor substrate. An end of the resistor 30 is connected to the terminal 15 for receiving an ON/OFF signal from the heater controller 9, and the other end thereof is grounded. When a predetermined voltage is applied to the terminal 15, a current corresponding to the voltage flows through the resistor 30 to generate heat.

Figure 7A:
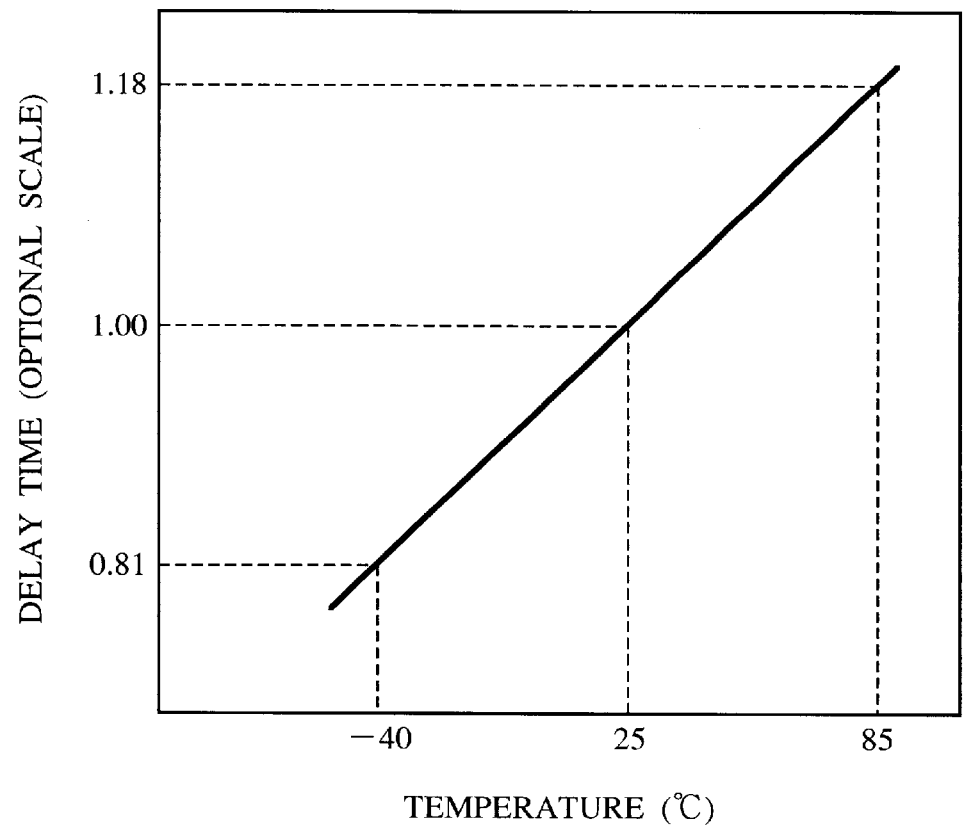
FIG. 7A is a graph showing the temperature dependency of delay time of cells that form a hard macro core.

The semiconductor device 1 of the first embodiment has temperature dependency in terms of delay time. FIG. 7A is a graph showing the temperature dependency of the delay time of cells that form the first and second hard macro cores 5 and 10 of the semiconductor device 1. An abscissa represents temperature in degrees centigrade and an ordinate indicates the relative delay time of the cells in optional scale. Generally, delay time differs from cell to cell. The temperature dependency of delay time of a cell, however, is constant irrespective of the kinds of cells. In FIG. 7A, the delay time of the cells at 25° C. is set to be 1.00, and then, the delay time of the cells at −40° C. is about 0.81, and at 85° C., about 1.18. In this way, a delay time changing ratio with respect to temperature change is constant irrespective of the kinds of cells. A delay time change caused by a temperature change sometimes malfunctions the first and second hard macro cores 5 and 10. The hard macro cores have different operating temperature ranges because they have different cell arrangements.

Figure 7B:
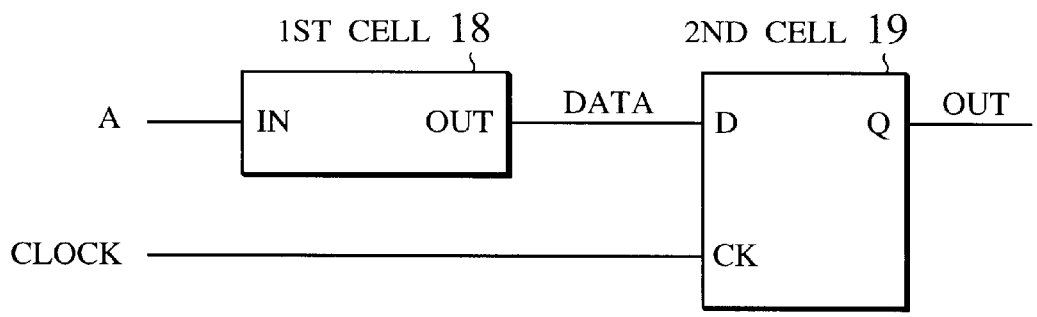
FIG. 7B is a block diagram showing cells that form a hard macro core.

FIG. 7B is a block diagram showing an example of a cell arrangement in a hard macro core. This hard macro core consists of a first cell 18 and a second cell 19. The first cell 18 receives an input signal A and provides an output signal DATA to a terminal D of the second cell 19 that is a D-type flip-flop. A terminal CK of the second cell 19 receives a clock signal CLOCK. When the clock signal CLOCK changes from 0 to 1, the second cell 19 fetches the signal DATA through the terminal D and provides an output signal OUT from a terminal Q. In other situation, the terminal Q shows no change. In the first cell 18, a delay time between receiving the input signal A and providing the out put signal DATA is 100 nsec at 25° C. From the graph of FIG. 7A, it is understood that the delay time of the first cell 18 is 81 nsec at −40° C. and 118 nsec at 85° C.

Figure 8A:
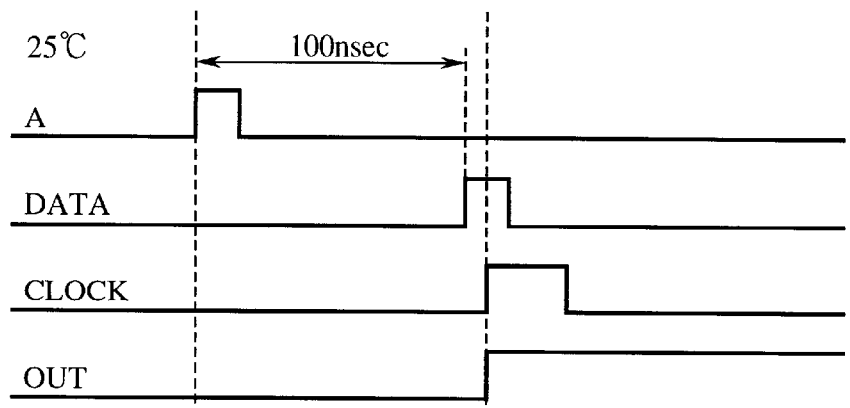
FIGS. 8A to 8C are the waveforms of signals in the hard macro core of FIG. 7B.
Figure 8B:
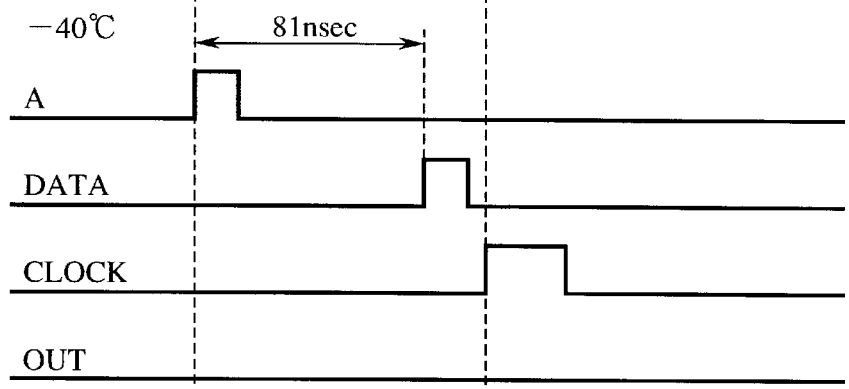
Figure 8C:
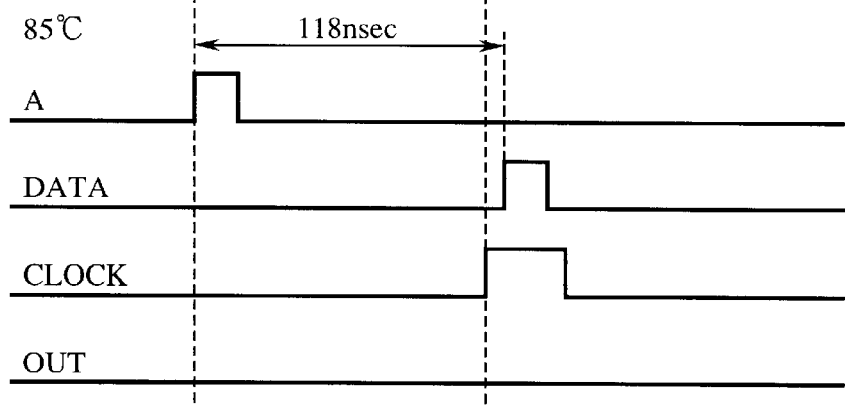

FIGS. 8A to 8C show the waveforms of signals in the hard macro core of FIG. 7B, in which FIG. 8A shows the waveforms of signals when the temperature of the hard macro core is 25° C. As mentioned above, the input signal A is supplied to the first cell 18 of the hard macro core, the output signal DATA is supplied to the terminal D of the second cell 19, the clock signal CLOCK is supplied to the terminal CK of the second cell 19, and the output signal OUT is provided from the terminal Q of the second cell 19. The pulse width, i.e., an interval of "1" of the input signal A is 10 nsec. After 100 nsec from a pulse of the input signal A, a pulse of the output signal DATA rises. When the clock signal CLOCK changes from 0 to 1, there is a pulse in the output signal DATA, and therefore, it is fetched by the second cell 19 to change the output signal OUT to 1. As a result, the hard macro core of FIG. 7B soundly operates at 25° C.

FIG. 8B shows the waveforms of signals when the temperature of the hard macro core of FIG. 7B is −40° C. After 81 nsec from a pulse of the input signal A, a pulse of the output signal DATA rises. When the clock signal CLOCK changes from 0 to 1, there is no pulse in the output signal DADS, and therefore, no pulse in the output signal DATA is fetched by the second cell 19, which keeps the output signal OUT at 0. Consequently, the hard macro core of FIG. 7B malfunctions at −40° C.

FIG. 8C sows the waveforms of signals when the temperature of the hard macro core of FIG. 7B is 85° C. After 118 nsec from a pulse of the input signal A, a pulse of the output signal DATA rises. When the clock signal CLOCK changes from 0 to 1, there is no pulse in the output signal DATA, and therefore, no pulse in the output signal DATA is fetched by the second cell 19, which keeps the output signal OUT at 0. Consequently, the hard macro core of FIG. 7B malfunctions at 85° C.

In this way, the timing of the output signal DATA disagrees with the tiring of the clock signal CLOCK if the temperature of the hard macro core is too low or too high. If this case, the second cell 19 is unable to correctly provide the output signal OUT, and the hard macro core malfunctions. Any hard macro core malfunctions if the temperature thereof is excessively low or high and soundly operates only in a specified operating temperature range. Each hard macro core has a specific operating temperature range that is determined by a cell arrangement in the hard macro core. According to the first embodiment, the second hard macro core 10 has an operating temperature range of –40° C. to 85° C., and the first hard macro core 5 of –10° C. Like the cells in hard macro cores, the inverters 22 of the oscillator 2 also have delay time that is dependent on temperature. The delay time of the oscillator 2 is in inverse proportion to the frequency of a signal to generate. Namely, if the temperature of the oscillator 2 drops, the frequency of a signal generated thereby increases. Namely, the temperature of the oscillator 2 is in inverse proportion to the frequency of a signal generated thereby.

Figure 9:
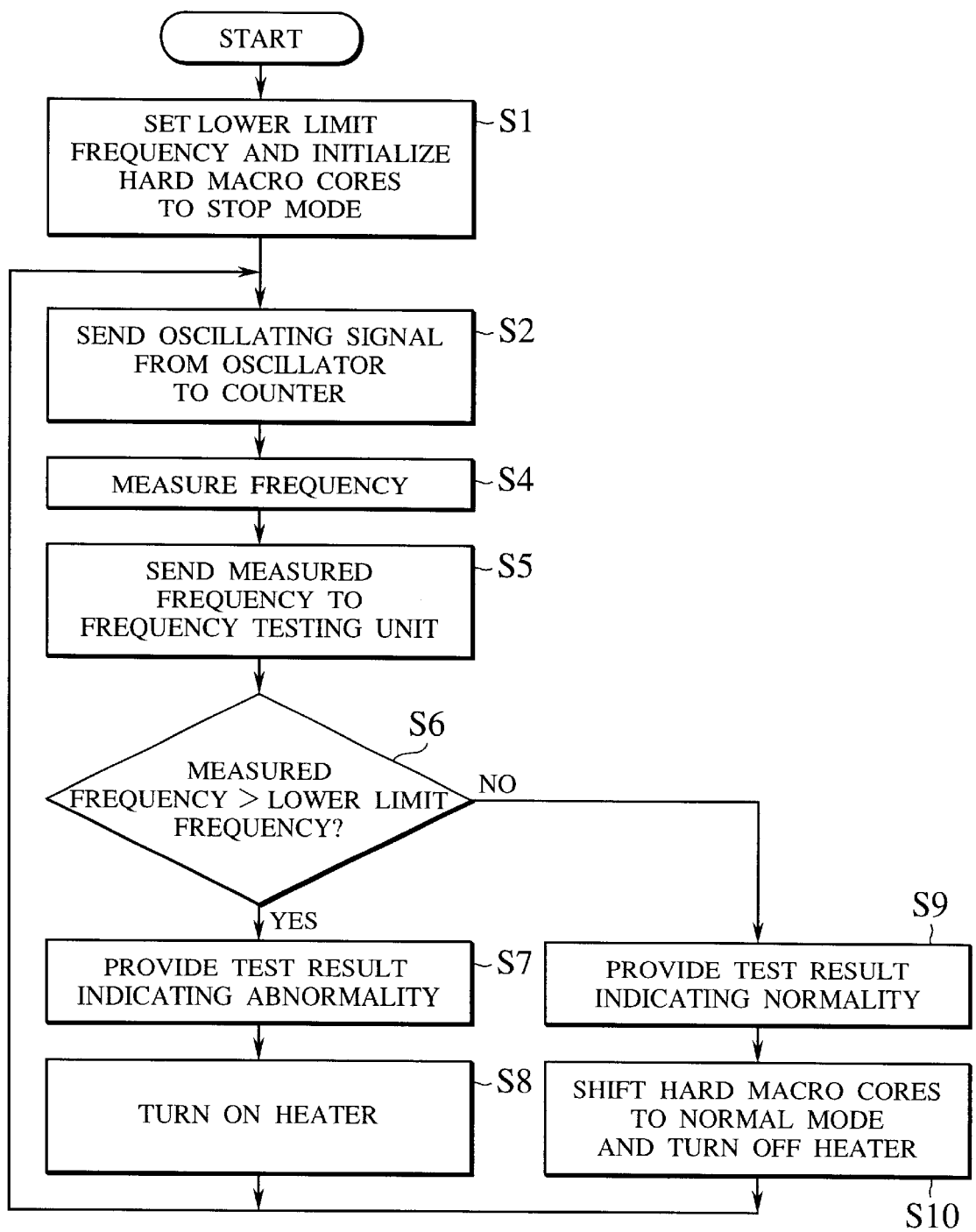
FIG. 9 is a flowchart showing the operation of the semiconductor device according to the first embodiment.

FIG. 9 is a flowchart showing the operation of the semiconductor device 1 of the first embodiment.

(1) Step S1 sets a lower limit frequency for abnormal frequencies in the counter 7 and sets the first and second hard macro cores 5 and 10 to a stop mode. The lower limit frequency is determined according to a lower limit of the operating temperature range of the first hard macro core 5. If the frequency of an oscillating signal generated by the oscillator 2 becomes higher than the lower limit frequency, the temperature will be lower than the operating temperature range of the first hard macro core 5. A correlation between the temperature of the oscillator 2 and the frequency of an oscillating signal generated thereby must be measured in advance by simulations.

(2) Step S2 sends an oscillating signal generated by the oscillator 2 to the counter 7. In step S4, the counter 7 measures the frequency of the oscillating signal, and in step S5, provides the testing unit 8 with the measured frequency.

(3) In step S6, the testing unit 8 determines whether or not the measured frequency is above the lower limit frequency. If it is above the lower limit frequency, the testing unit 8 provides, in step S7, the heater controller 9 with a test result signal indicating that the measured frequency is abnormal. According to the test result signal, the heater controller 9 turns on the heater 4 in step S8. The heater 4 generates heat to increase the temperature of the oscillator 2, heater 4, and first hard macro core 5. Thereafter, step S2 is again carried out.

(4) If step S6 determines that the measured frequency is below the lower limit frequency, the testing unit 8 provides, in step S9, the hard macro cores 5 and 10 and heater controller 9 with a test result signal indicating that the measured frequency is normal. According to the test result signal, the heater controller 9 turns off the heater 4 in step S10. At the same time, the hard macro cores 5 and 10 are shifted from the stop mode to a normal operation mode. Thereafter, step S2 is again carried out.

The operation of the semiconductor device of FIG. 2 will be explained in more detail with reference to FIG. 9. It is assumed that an ambient temperature range to use the semiconductor device is –40° C. to –10° C. and that the temperature of the first semiconductor chip 11 is at an ambient temperature at the start of operation. In the temperature range of –40° C. to –10° C., the second hard macro core 10 may soundly operate but the first hard macro core 5 may malfunction.

(1) Step S1 sets a lower limit frequency for abnormal frequencies in the counter 7. The lower limit frequency is determined from a temperature of –10° C. that is the lowest temperature at which the first hard macro core 5 soundly operates. In this example, the lower limit frequency is determined based on 0° C. that is higher than the lowest operating temperature of –10° C. and is set in the counter 7. Step S1 also sets the first and second hard macro cores 5 and 10 to a stop mode.

(2) Steps S2 to S5 are the same as those explained above.

(3) Step S6 determines whether or not the frequency of an oscillating signal generated by the oscillator 2 is higher than the lower limit frequency. In this example, the temperature of the oscillator 2 on the first semiconductor chip 11 is lower than –10° C., and therefore, the frequency of the oscillating signal is higher than the lower limit frequency. Accordingly, step S7 is carried out in which the testing unit 8 provides the heater controller 9 with a test result signal indicating that the frequency is abnormal. In step S8, the heater controller 9 turns on the heater 4. Then, step S2 is again carried out to form a loop.

(4) After repeating the loop several times, the heater 4 increases the temperature of the oscillator 2 and first hard macro core 5. When the temperature of the oscillator 2 increases above 0° C., the frequency of an oscillating signal generated by the oscillator 2 becomes lower than the lower limit frequency.

(5) Then, step S6 determines that the frequency of the oscillating signal is below the lower limit frequency. In step S9, the testing unit 8 provides a test result signal indicating that the frequency is normal. The test result signal is transferred to the heater controller 9, the fist hard macro core 5 through the terminal 16, and the second hard macro core 10 through the terminal 17. In step S10, the heater controller 9 turns off the heater 4 through the terminal 15. At the same time, the first and second hard macro cores 5 and 10 are shifted to a normal operation mode. Consequently, the semiconductor device of FIG. 2 functions as a system LSI.

(6) The loop staring from step S2 is repeated. If the temperature of the oscillator 2 drops below 0° C., step S6 determines that the frequency of an oscillating signal generated by the oscillator 2 is higher than the lower limit frequency, to turn on the heater 4. At this time, it is not necessary to shift the first and second core macros 5 and 10 to the stop mode. This is because the lower limit frequency is set to be lower than a frequency that corresponds to the lowest operating temperature of –10° C.

In this way, if the temperature of the first hard macro core 5 drops below the lowest operating temperature thereof, the frequency tester 3 of the first embodiment detects abnormality in the frequency of an oscillating signal generated by the oscillator 2 that is under the same temperature condition as the first hard macro core 5. Then, the first embodiment turns on the heater 4, which is also under the same temperature condition as the first hard macro core 5, to increase the temperature of the first hard macro core 5 and oscillator 2 to a level at which the first hard macro core 5 soundly operates. Thereafter, the frequency tester 3 may detect a normal frequency, to shift the first hard macro core 5 to a normal operation mode. In this way, the first embodiment heats the first hard macro core 5 so that the temperature of the first hard macro core 5 may not drop below the lowest operating temperature thereof and so that the first hard macro core 5 may correctly operate even in an ambient temperature that is lower than the lowest operating temperature.

Consequently, the semiconductor device of the first embodiment secures a wide operating temperature range, automatically starts operation at a specified operating speed even in low temperatures, and increases the degree of freedom of designing due to the wide operating temperature range that is secured without extending delay time.

The frequency at which the heater 4 is turned off may be set from a temperature that is higher than the lowest operating temperature. This extends an interval between the ON and OFF states of the heater 4, thereby reducing the number of ON/OFF operations of the heater 4.

Second Embodiment

Figure 10:
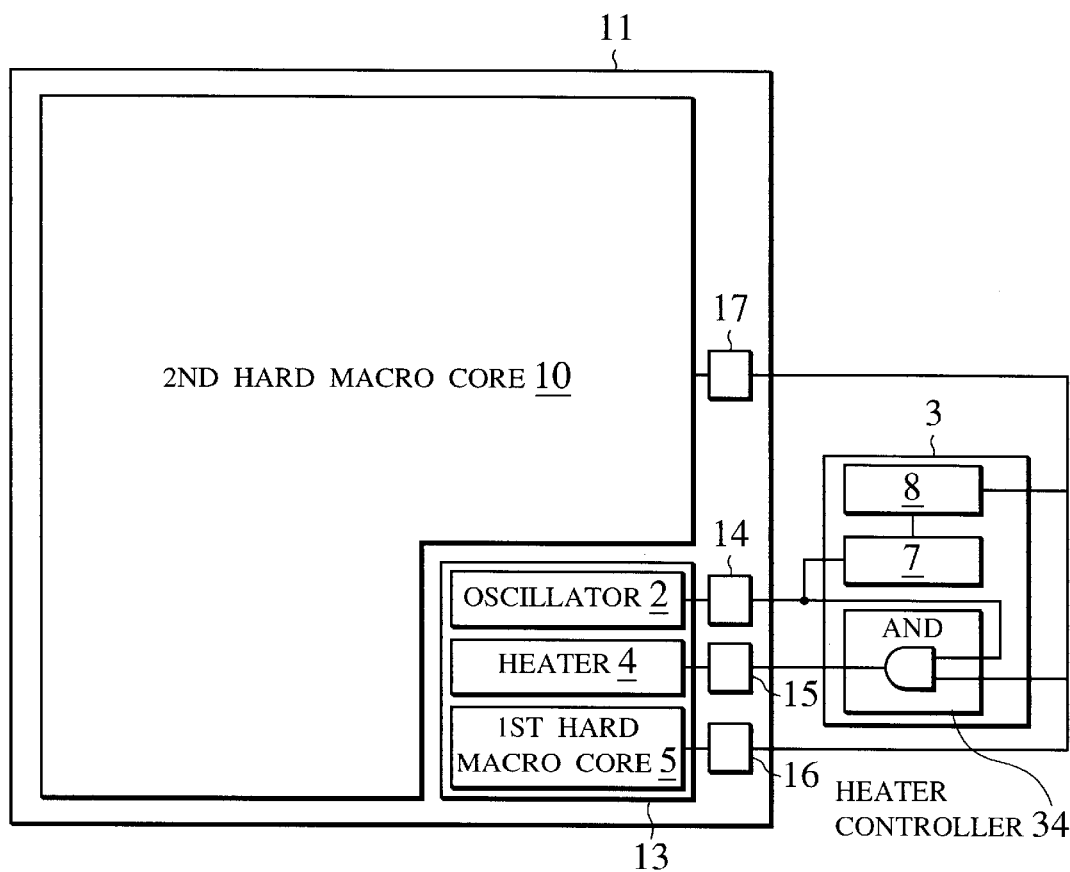
FIG. 10 is a plan view showing a semiconductor device according to a second embodiment of the present invention.

FIG. 10 is a plan view showing a semiconductor device according to the second embodiment of the present invention. This embodiment is characterized by a heater controller 34 having an AND circuit for controlling a heater 4. The heater 4 is made of two buffer 23 and 24 as shown in FIG. 5A The other parts of the second embodiment are the same as those of FIG. 2. The AND circuit has two input terminals and an output terminal. One of the input terminals is connected to an oscillator 2 through an output terminal 14. The other input terminal is connected to a frequency testing unit 8. The output terminal of the AND circuit is connected to the heater 4 through an ON/OFF terminal 15.

The input terminals of the AND circuit receive a test result signal from the testing unit 8 and an oscillating signal from the oscillator 2.

The test result signal is 0 to indicate normality, or 1 to indicate abnormality. The oscillating signal generated by the oscillator 2 alternates between logic levels 1 and 0 as shown in FIGS. 4B and 4C. The frequency of the oscillating signal is in inverse proportion to the temperature of inverters 22 of the oscillator 2. If the test result signal indicates normality, the AND circuit provides an output signal of 0. If the test result signal indicates abnormality, the AND circuit provides an output signal that alternates between logic levels 1 and 0. While the output signal is alternating between 1 and 0, a through current flows between a source voltage (Vdd) and a ground potential in the heater 4 to generate heat.

According to the second embodiment, the heater 4 receives a signal that alternates between logic levels 1 and 0 while the test result signal is indicating frequency abnormality. The frequency of the signal to the heater 4 is in inverse proportion to the temperature of the oscillator 2. Namely, the frequency increases as the temperature of the oscillator 2 drops to, for example, −40° C., to increase the number of times to pass a through current, thereby speedily generating heat. On the other hand, the frequency decreases as the temperature increases to, for example, 0° C., to slowly generate heat. This prevents an overshoot or a large fluctuation in temperature. The effect of the first embodiment is also provided by the second embodiment.

Third Embodiment

Figure 11:
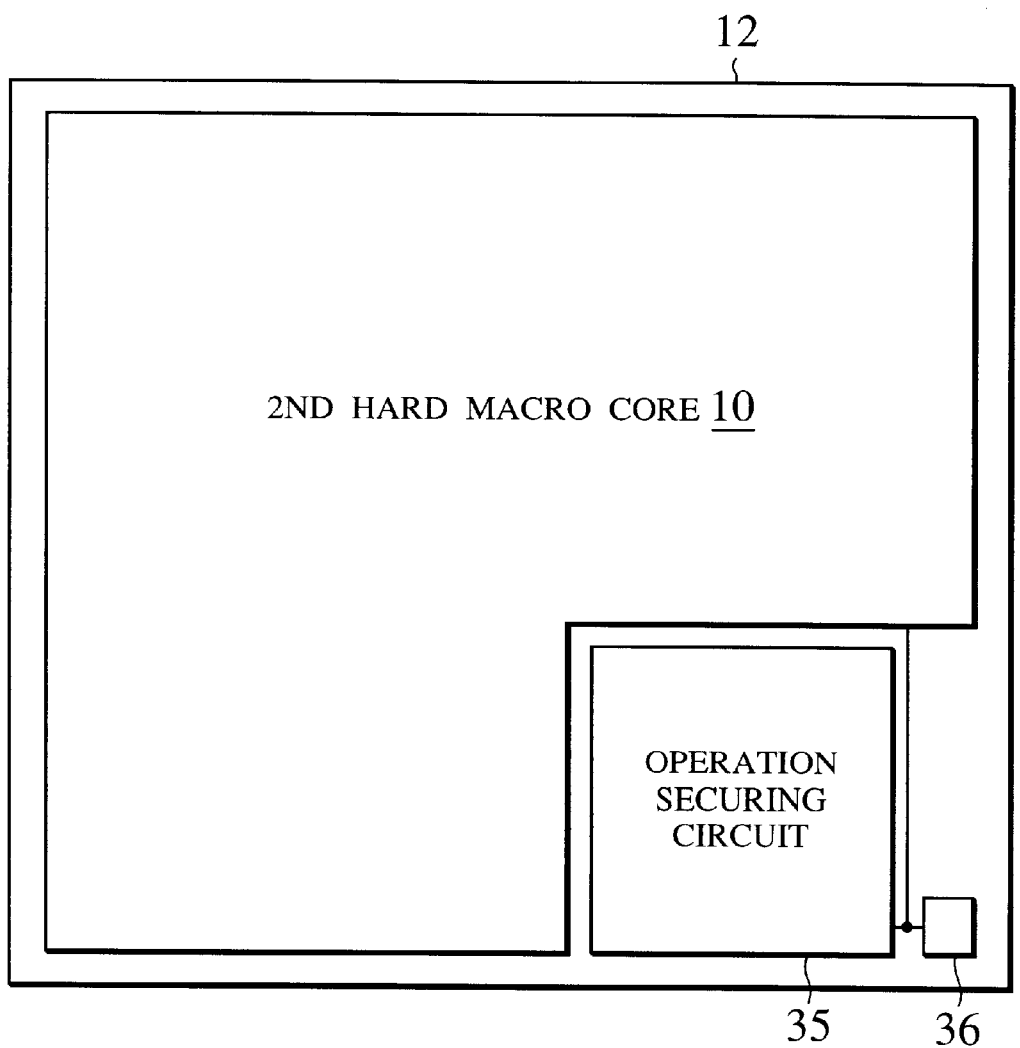
FIG. 11 is a plan view showing a semiconductor device according to a third embodiment of the present invention.

FIG. 11 is a plan view showing a semiconductor device according to the third embodiment of the present invention. The semiconductor device is a system LSI formed on a first semiconductor chip 12 and includes a second hard macro core 10, an operation securing circuit 35, and an output terminal 36 for providing a test result signal. The operation securing circuit 35 has, like the one shown in FIG. 1, an oscillator 2, a frequency tester 37, a heater 4, and a first hard macro core 5. Namely, the operation securing circuit 35 consists of the circuit area 13 of the semiconductor chip 11 of FIG. 2 plus the frequency tester 37. The output terminal 36 is connected to the second hard macro core 10 and operation securing circuit 35. Since the frequency tester 37 is on the first semiconductor chip 12, there are no output terminal 14 for the oscillator 2 or the ON/OFF terminal 15 for the heater 4. Namely, the semiconductor device of the third embodiment consists of the single semiconductor chip 12.

Figure 12:
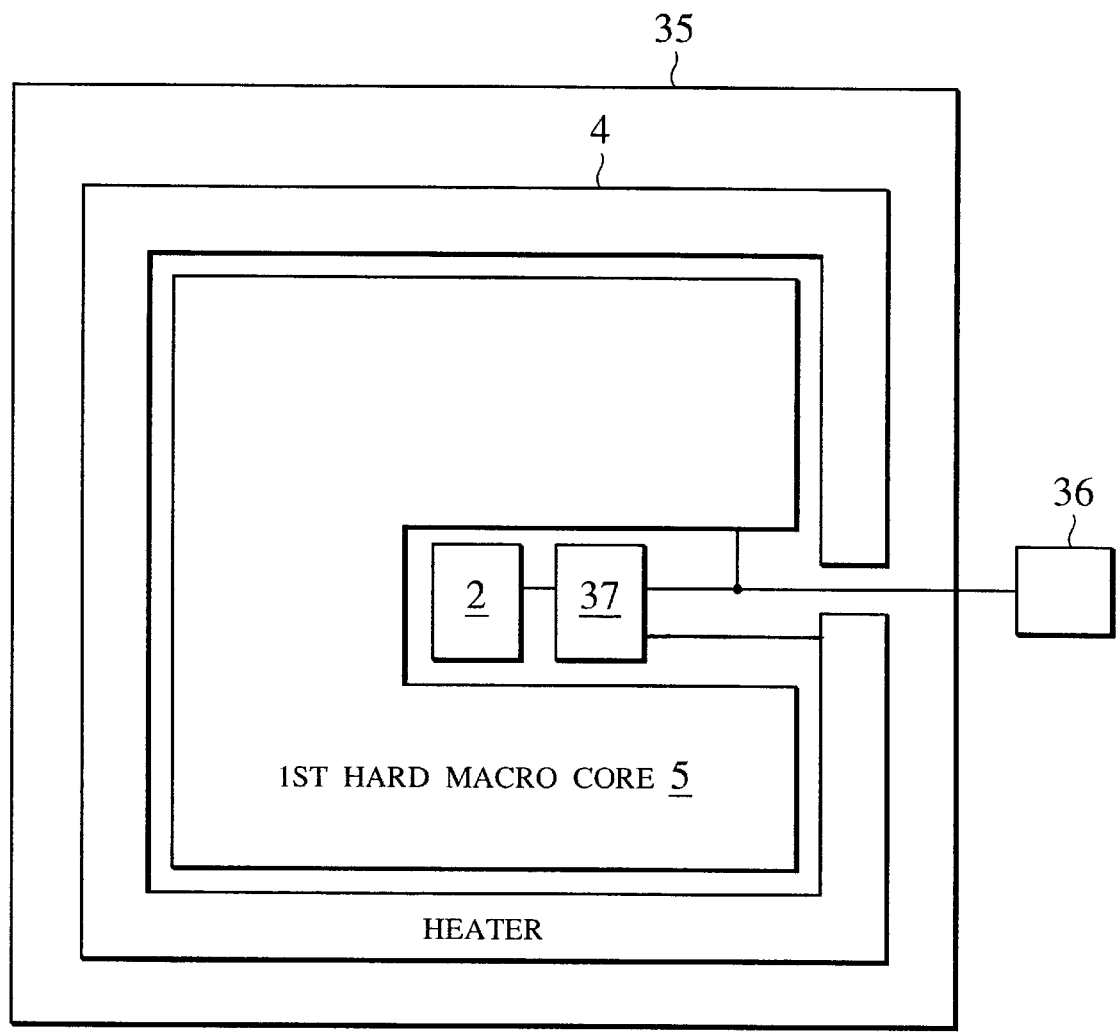
FIG. 12 is a plan view showing the details of an operation securing circuit 35 of FIG. 11.

FIG. 12 is a plan view showing the details of the operation securing circuit 35. The operation securing circuit 35 consists of the oscillator 2, the frequency tester 37, the first hard macro core 5 arranged around the oscillator 2 and frequency tester 37, and the heater 4 arranged around the first hard macro core 5. The output terminal 36 for providing a test result signal is connected to the frequency tester 37 and fist hard macro core 5. One or a plurality of oscillators 2 may be arranged at the periphery of the operation securing circuit 35, to improve heating efficiency and reduce the power consumption of the heater 4. The first hard macro core 5 may be made of a plurality of hard macro cores. In this case, each of the hard macro cores is connected to the terminal 36.

Figure 13:
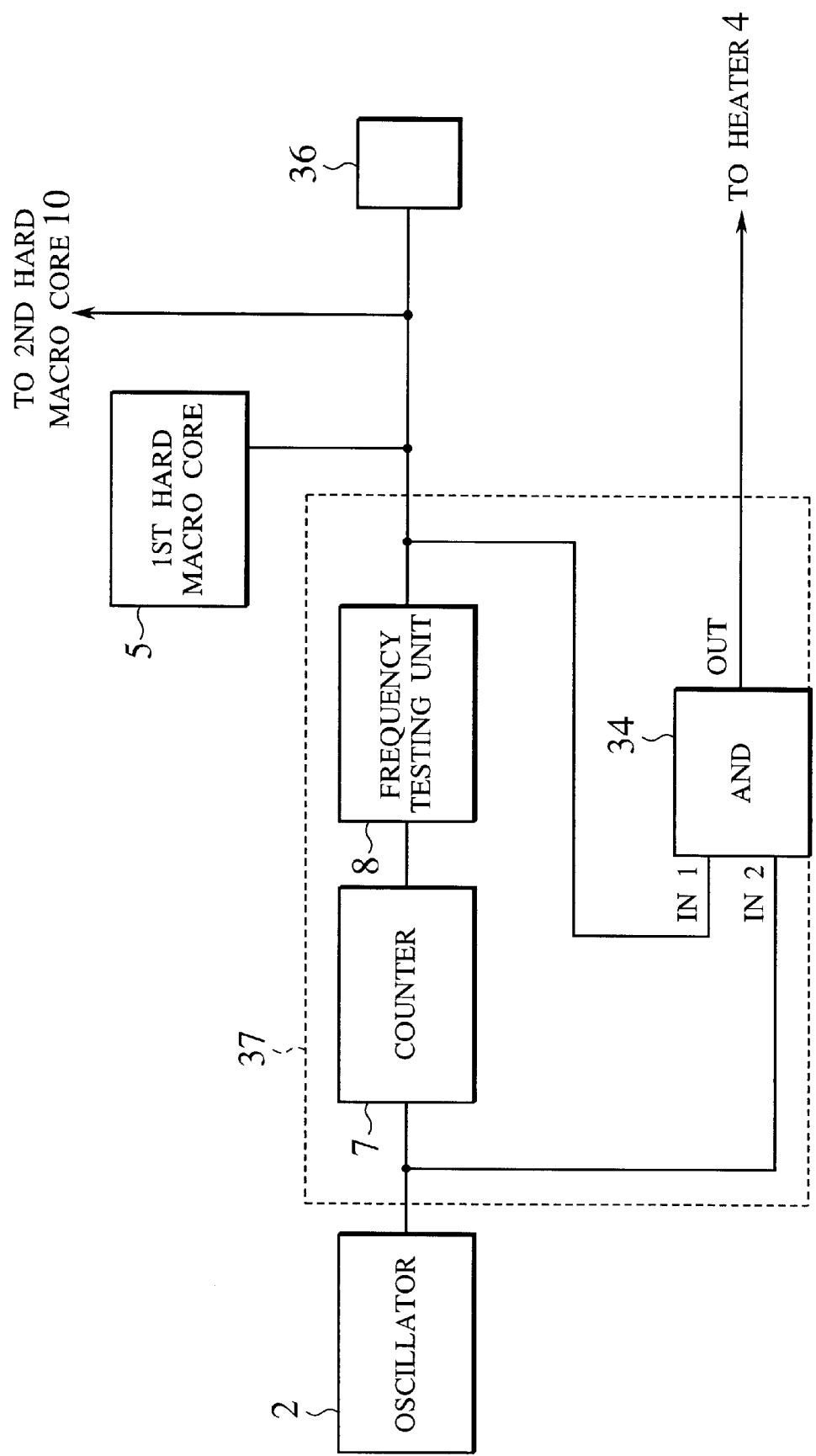
FIG. 13 is a block diagram showing the details of a frequency tester 37 of FIG. 12.

FIG. 13 is a block diagram showing the frequency tester 37. The frequency tester 37 consists of a counter 7, a testing unit 8, and a heater controller 34 having an AND circuit. The counter 7 receives an oscillating signal from the oscillator 2 and measures the frequency thereof. The measured frequency is sent to the testing unit 8, which provides a test result signal. The test result signal is supplied to an input terminal IN1 of the AND circuit of the heater controller 34, the first hard macro core 5, the second hard macro core 10, and the output terminal 36. The other input terminal IN2 of the AND circuit receives the oscillating signal from the oscillator 2 The output of the AND circuit is supplied to the heater 4. The heater 4 consists of buffers (23, 24) as shown in FIG. 5A.

In this way, the third embodiment forms the frequency tester 37 on the first semiconductor chip 12, thereby forming a semiconductor device with the single semiconductor chip 12. This arrangement reduces the number of parts of the semiconductor device, to reduce the manufacturing cost and size thereof. The third embodiment also provides the effects of the first and second embodiments.

Fourth Embodiment

Figure 14:
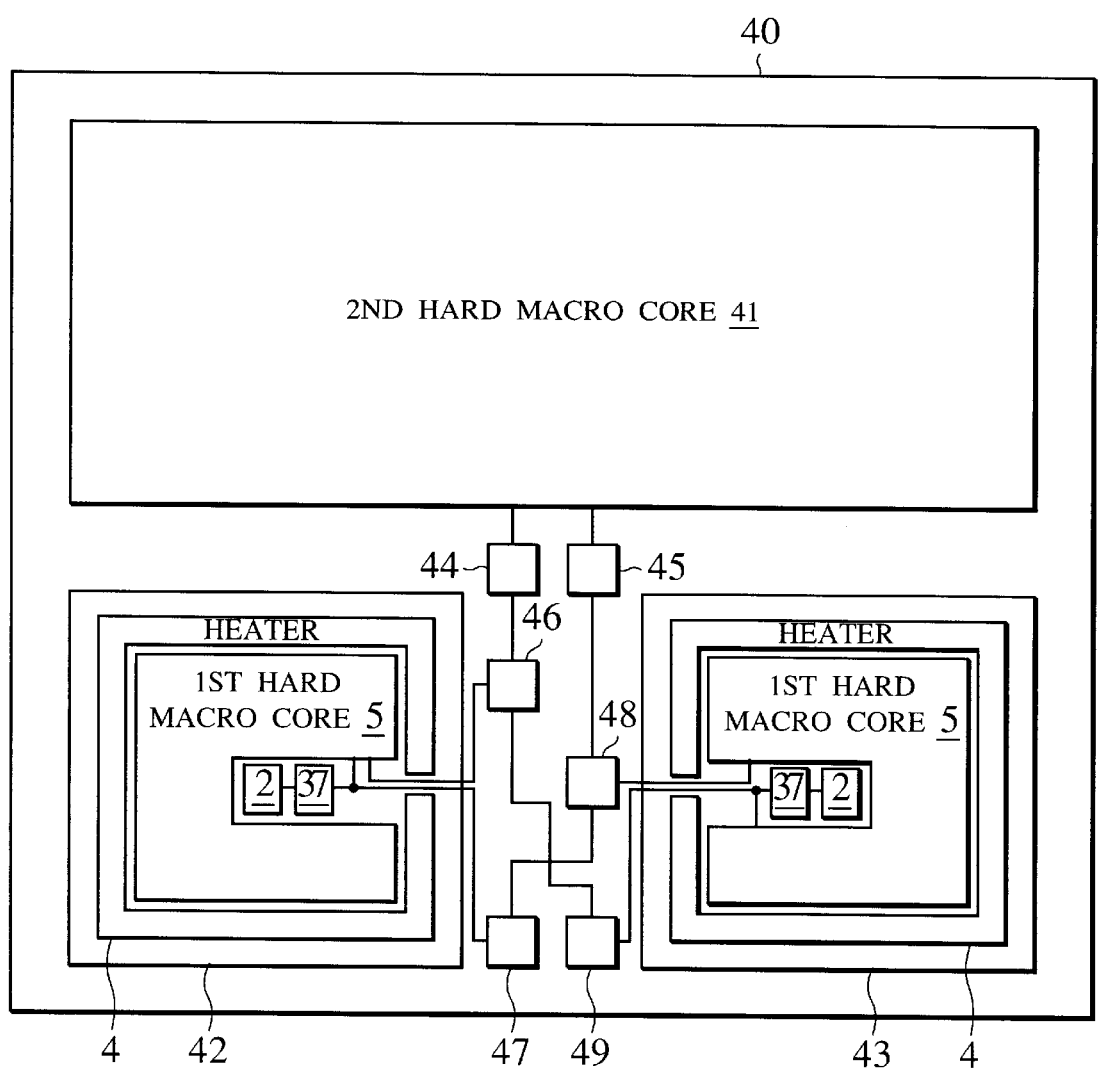
FIG. 14 is a plan view showing a semiconductor device according to a fourth embodiment of the present invention.

FIG. 14 is a plan view showing a semiconductor device according to the fourth embodiment of the present invention. This semiconductor device is characterized by a plurality of operation securing circuits 42 and 43 formed on a first semiconductor chip 40. All hard macro cores related to the operation securing circuits 42 and 43 are initially set to a stop mode and are shifted to a normal operation mode when each frequency tester of the operation securing circuits 42 and 43 determines that there is no frequency abnormality.

The semiconductor device of the fourth embodiment is a system LSI formed on the first semiconductor chip 40 and consisting of the first and second operation securing circuits 42 and 43 and a second hard macro core 41. Like the one shown in FIG. 12, each of the operation securing circuits 42 and 43 has an oscillator 2, a frequency tester 37, a first hard macro core 5 arranged around the oscillator 2 and frequency tester 37, and a heater 4 arranged around the first hard macro core 5. Like the one shown in FIG. 13, the frequency tester 37 has a counter 7, a testing unit 8, and a heater controller 34 having an AND circuit.

The frequency tester 37 in the first operation securing circuit 42 provides a test result signal to an output terminal 47 from which the test result signal is supplied to the outside. The test result signal is transferred to the first hard macro core 5 in the second operation securing circuit 43 through an input terminal 48. Also, the test result signal is supplied to the second hard macro core 41 through an input terminal 45. Similarly, a test result signal from the frequency tester 37 in the second operation securing circuit 43 is sent to an output terminal 49. Then, the test result signal is passed through input terminals 46 and 44 to the first hard macro core 5 in the first operation securing circuit 42 and the second hard macro core 41.

In this way, the frequency tester 37 in the first operation sewing circuit 42 provides the test result signal thereof to the first hard macro core 5 in the second operation securing circuit 43 and the second hard macro core 41. At the same time, the frequency tester in the second operation securing circuit 43 provides the test result signal thereof to the first hard macro core 5 in the first operation securing circuit 42 and the second hard macro core 41. Namely, any one of the operation securing circuits controls the first hard macro core in the other operation securing circuit. As a result, all hard macro cores in the semiconductor chip 40 are shifted from a stop mode to a normal operation mode only when the temperatures of the fist and second operation securing circuits 42 and 43 increase to a level at which the first hard macro cores 5 in the circuits 42 and 43 soundly operate.

Figure 15:
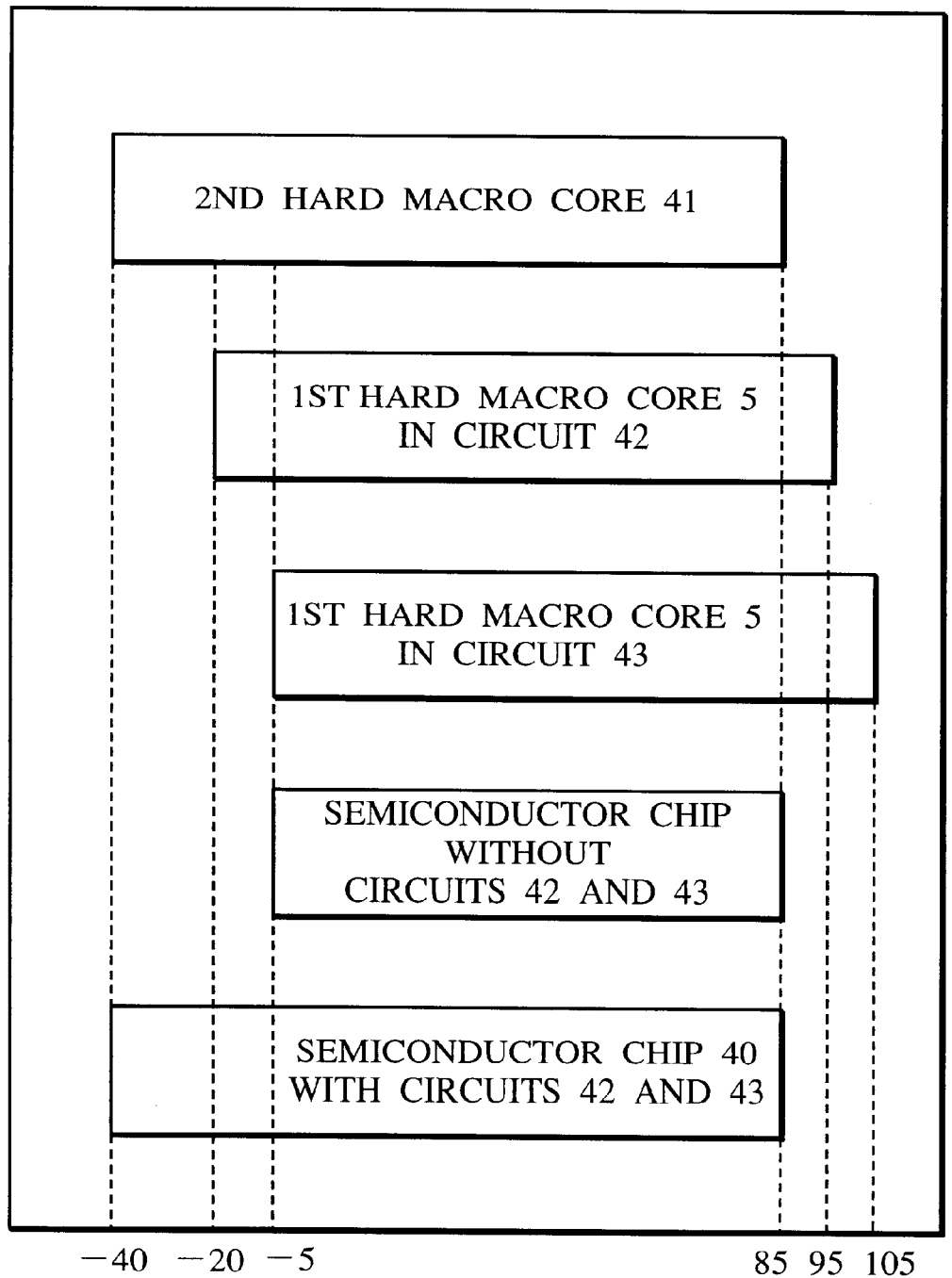
FIG. 15 shows the operating temperature ranges of a semiconductor chip 40 of FIG. 14 and hard macro cores in the semiconductor chip.

FIG. 15 shows the operating temperature ranges of the first hard macro cores 5 and the second hard macro core 41 and the first semiconductor chip 40. The second hard macro core 41 has an operating temperature range of –40° C. to 85° C. The first hard macro core 5 in the first operation securing circuit 42 has an operating temperature range of –20° C. to 95° C. The first hard macro core 5 in the second operation securing circuit 43 has an operating temperature range of –5° C. to 105° C. In this way, the hard macro cores have different operating temperature ranges. If there are no operation securing circuits, the first semiconductor chip 40 has an operating temperature range of –5° C. to 85° C. The operating temperature range of the semiconductor chip 40 having the operation securing circuits is –40° C. to 85° C.

The operation of a semiconductor device made of the first semiconductor chip 40 wil be explained with reference to FIG. 9. It is assumed that the first semiconductor chip 40 is started in an ambient temperature of –20° C. to –40° C. and that the temperature of the semiconductor chip 40 is equal to an ambient temperature. The flow mentioned below is executed separately on the first and second operation securing circuits 42 and 43.

(1) Step S1 sets a lower limit frequency for abnormal frequencies in the counter 7. The lower limit frequency is determined from the lowest operating temperature (–20° C. in the circuit 42 and –5° C. in the circuit 43) of the first hard macro core 5. For example, the lower limit frequency is set from –10° C. for the circuit 42 and 5° C. for the circuit 43. These temperatures are higher than the lowest operating temperatures of –2° C. and –5° C. for keeping allowance. The frequency of an oscillating signal generated by the oscillator 2 corresponding to –10° C. is set in the counter 7 in the circuit 42, and that corresponding to 5° C. in the counter 7 in the circuit 43. The first hard macro cores 5 and the second hard macro core 41 are set to a stop mode.

(2) Steps S2 to S5 are the same as those explained with reference to FIG. 9.

(3) Step S6 determines whether or not the frequency of the oscillating signal from the oscillator 2 is higher than the lower limit frequency. At this time, the temperature of the first semiconductor chip 40 is lower than –20° C., and therefore, the frequency is higher than the lower limit frequency. Accordingly, step S7 is carried out in which the testing unit 8 provides the heater controller 9 with a test result signal indicating that the frequency is abnormal. In step S8, the heater controller 9 turns on the heater 4. Then, step S2 is again carried out to form a loop.

(4) After repeating the loop several times, the heater 4 increases the temperature of the oscillator 2 and first hard macro core 5. When the temperature of the oscillator 2 increases above –10° C., the frequency of the oscillating signal from the oscillator 2 in the circuit 42 becomes lower than the lower limit frequency, and the heater controller 9 tums off the heater 4. As a result, a test result signal indicating frequency normality is supplied from the circuit 42 to all hard macro cores 5 and 41. However, the frequency of the oscillating signal from the oscillator 2 in the circuit 43 is higher than the lower limit frequency, and therefore, all hard macro cores Sand 41 keep the stop mode.

(5) When the temperature of the oscillator 2 in the circuit 43 increases above 5° C. due to the heater 4, the frequency of the oscillating signal from the oscillator 2 becomes lower than the lower limit frequency, and the heater controller 9 turns off the heater 4. At the same time, a test result signal indicating frequency normality is supplied from the circuit 43 to all hard macro cores 5 and 41.

(6) As a result, the testing units 8 in the circuits 42 and 43 provide each a test result signal indicating frequency normality to all hard macro cores 5 and 41. Only at this moment, all hard macro cores 5 and 41 on the first semiconductor chip 40 are shifted from the stop mode to a normal operation mode. As a result, the semiconductor device of FIG. 14 functions as a system LSI.

The first semiconductor chip 40 of the fourth embodiment has two or more hard macro cores 5 each having an operation securing circuit, to extend the operating temperature range of the semiconductor chip 40 from –5° C. to –40° C. without redesigning the hard macro cores. Namely, the semiconductor chip 40 having the operation securing circuits 42 and 43 realizes an operating temperature range of –40° C. to 85° C. as shown in FIG. 15.

Fifth Embodiment

Figure 16:
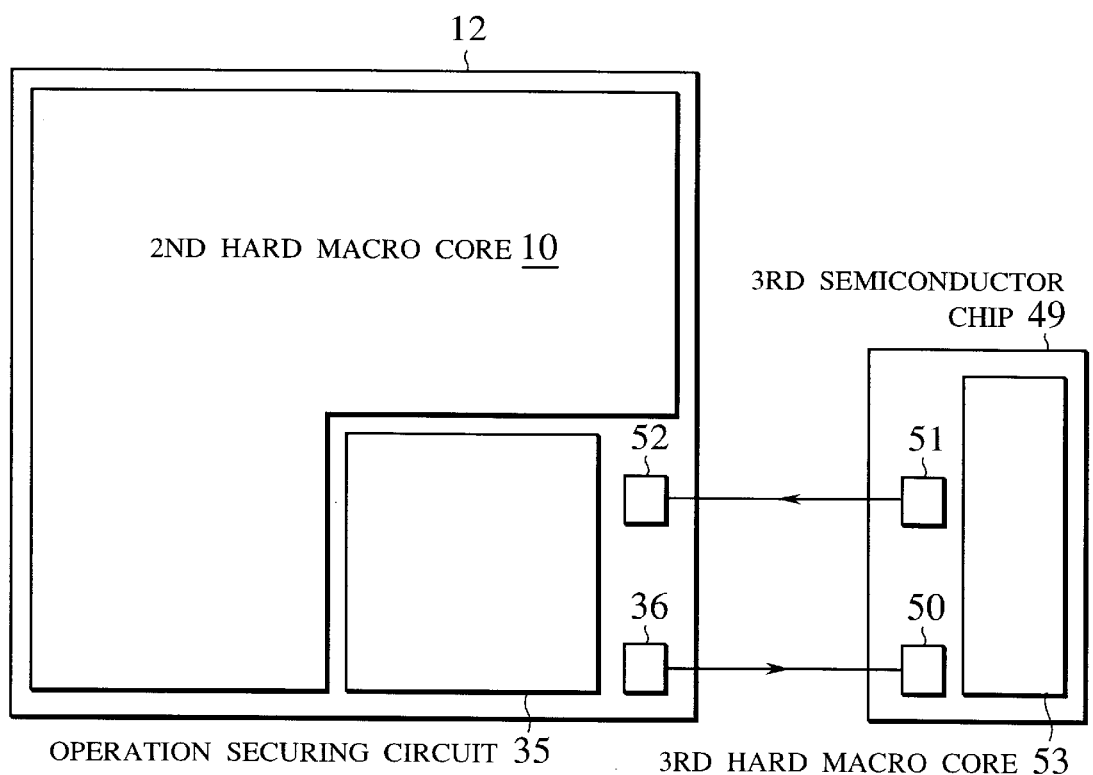
FIG. 16 is a plan view showing a semiconductor device according to a fifth embodiment of the present invention.

FIG. 16 is a plan view showing a semiconductor device according to the fifth embodiment of the present invention. This semiconductor device consists of a first semiconductor dip 12 and a third semiconductor chip 49. The third chip 49 has a third hard macro core 53 that is initially set to a stop mode and is shifted to a normal operation mode when a test result signal provided by a frequency tester 3 indicates a normal frequency. Like the semiconductor chip of FIG. 11, the fist semiconductor chip 12 has an operation securing circuit 35, a second hard macro core 10, and an output terminal 36 for providing a test result signal The first chip 12 further has an input terminal 52 connected to the second hard macro core 10 and a first hard macro core 5 that is in the operation securing circuit 35. The third chip 49 has an input terminal 50 and an output terminal 51 both connected to the third hard macro core 53. The third chip 49 has no operation securing circuit. The output terminal 36 is connected to the input terminal 50, and the output terminal 51 is connected to the input terminal 52.

The operation securing circuit 35 provides a test result signal to the third hard macro core 53 so that the third hard macro core 53 is shifted Em the stop mode to the normal operation mode according to an instruction from the operation securing circuit 35. If the third hard macro core 53 is unable to operate normally, it may provide a signal to stop the first and second hard macro cores 5 and 10 through the terminals 51 and 52.

According to the fifth embodiment, the operation securing circuit 35 on the first chip 12 switches the third hard macro core 53 on the third chip 49 from the stop mode to the normal operation mode. In this way, the present invention is applicable not only to a semiconductor chip having a plurality of hard macro cores but also to a plurality of semiconductor chips each having hard macro cores.

What is claimed is:

1. A semiconductor device comprising an operation securing circuit that has:
   oscillation means for generating an oscillating signal whose frequency is dependent on temperature;
   frequency testing means for determining whether or not the frequency of the oscillating signal is normal;
   heating means for generating heat if the frequency testing means determines that the frequency is abnormal; and
   a first hard macro core that is shifted to a normal operation mode if the frequency testing means determines that the frequency is normal,
   the oscillation means, heating means, and first hard macro core being put under the same temperature condition,
   the frequency testing means employing a lower limit of an operating temperature range of the first hard macro core as a reference to determine whether or not the frequency of the oscillating signal is normal.

2. The semiconductor device of claim 1, wherein the frequency testing means has:
   counting means for measuring the frequency of the oscillating signal generated by the oscillation means;
   testing means for determining whether or not the measured frequency is normal and providing a test result signal; and
   control means for turning on the heating means if the test result signal indicates that the measured frequency is abnormal and turning off the heating means if the test result signal indicates that the measured frequency is normal.

3. The semiconductor device of claim 2, wherein the oscillation means, heating means, and first hard macro core are arranged on a first semiconductor chip.

4. The semiconductor device of claim 3, further comprising:
   a second hard macro core arranged on the first semiconductor chip, having a different cell arrangement from the first hard macro core, being started under a stop mode, and being shifted to a normal operation mode after the frequency testing means determines that the frequency is normal.

5. The semiconductor device of claim 3, wherein the frequency testing means is arranged on a second semiconductor chip that is different from the first semiconductor chip.

6. The semiconductor device of claim 3, wherein the first hard macro core is arranged around the oscillation means and the heating means is arranged around the first hard macro core.

7. The semiconductor device of claim 1, wherein the oscillation means is ring oscillation means consisting of an odd number of inverters connected in series with the last inverter being connected to the first inverter.

8. The semiconductor device of claim 1, wherein the heating means has:
   a pre-buffer made of a PMOS and an NMOS connected in parallel and having small driving capacity; and
   a main buffer made of a PMOS and an NMOS that are connected in parallel with each other and are connected to the pre-buffer in series, having large driving capacity.

9. The semiconductor device of claim 8, wherein the PMOS of the main buffer has a capacitor of large capacitance between the gate and source electrodes thereof.

10. The semiconductor device of claim 8, wherein the NMOS of the main buffer has a capacitor of large capacitance between the gate and source electrodes thereof.

11. The semiconductor device of claim 1, wherein the heating means is made of a resistor.

12. The semiconductor device of claim 8, wherein the control means has an AND circuit for receiving the test result signal from the testing means and the oscillating signal from the oscillation means and providing an output signal to the heating means.

13. The semiconductor device of claim 4, wherein the frequency testing means is arranged on the first semiconductor chip.

14. The semiconductor device of claim 4, further comprising:
   a plurality of operation securing circuits formed on the first semiconductor chip, so that all hard macro cores in the operation securing circuits are started under a stop mode and are shifted to a normal operation mode when all frequency testing means in the operation securing circuits determine that the frequencies of oscillating signals generated by oscillation means are normal.

15. The semiconductor device of claim 13, further comprising:
   a third hard macro core arranged on a third semiconductor chip, the third hard macro core being started under a stop mode and being shifted to a normal operation mode when the frequency testing means determines that the frequency of the oscillating signal generated by the oscillation means is normal.

16. A semiconductor chip comprising an operation securing circuit that has:
   an oscillator for generating an oscillating signal whose frequency is dependent on temperature;
   a frequency tester for determining whether or not the frequency of the oscillating signal is normal;
   a heater for generating heat if the frequency tester determines that the frequency is abnormal; and
   a first functional block that is shifted to a normal operation mode if the frequency tester determines that the frequency is normal,
   the frequency tester employing a lower limit of an operating temperature range of the first functional block as a reference to determine whether or not the frequency of the oscillating signal is normal.

17. The semiconductor chip of claim 16, wherein the frequency tester has:
   a counter for measuring the frequency of the oscillating signal generated by the oscillator;
   a testing unit for determining whether or not the measured frequency is normal and providing a test result signal; and
   a heater controller for turning on the heater if the test result signal indicates that the measured frequency is abnormal and turning off the heater if the test result signal indicates that the measured frequency is normal.

18. The semiconductor chip of claim 17, further comprising a second functional block having a different cell arrangement from the first functional block, the second functional block being started under a stop mode and being shifted to a normal operation mode after the frequency tester determines that the frequency is normal.

19. The semiconductor chip of claim 18, wherein the first functional block is arranged around the oscillator and the heater is arranged around the first functional block.

20. The semiconductor chip of claim 19, further comprising:
   a plurality of operation securing circuits, so that all functional blocks in the operation securing circuits are started under a stop mode and are shifted to a normal operation mode when all frequency testers in the operation securing circuits determine that the frequencies of oscillating signals generated by oscillators are normal.

* * * * *